United States Patent
Im et al.

(10) Patent No.: US 7,811,834 B2
(45) Date of Patent: Oct. 12, 2010

(54) METHODS OF FORMING A FERROELECTRIC LAYER AND METHODS OF MANUFACTURING A FERROELECTRIC CAPACITOR INCLUDING THE SAME

(75) Inventors: Dong-Hyun Im, Seoul (KR); Ik-Soo Kim, Gyeonggi-do (KR); Choong-Man Lee, Seoul (KR); Jang-Eun Heo, Seoul (KR); Sung-Ju Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/183,657

(22) Filed: Jul. 31, 2008

(65) Prior Publication Data

US 2009/0035877 A1    Feb. 5, 2009

(30) Foreign Application Priority Data

Jul. 31, 2007   (KR) .................. 10-2007-0076678

(51) Int. Cl.
H01L 21/00   (2006.01)

(52) U.S. Cl. .................... 438/3; 438/240; 438/393; 257/E21.008

(58) Field of Classification Search .................. 438/3, 438/240, 393; 257/E21.008
See application file for complete search history.

(56) References Cited

U.S. PATENT DOCUMENTS

| 7,485,189 B2 * | 2/2009 | Satake et al. ............... 118/689 |
| 2006/0172485 A1 | 8/2006 | Vaartstra |
| 2006/0269667 A1 | 11/2006 | Ma et al. |

FOREIGN PATENT DOCUMENTS

KR    1020060003895 A    1/2006

* cited by examiner

*Primary Examiner*—Jack Chen
(74) *Attorney, Agent, or Firm*—Myers Bigel Sibley & Sajovec, PA (57) ABSTRACT

A method of forming a ferroelectric layer is provided. A metal-organic source gas is provided into a chamber into which an oxidation gas is provided for a first time period to form ferroelectric grains on a substrate. A ferroelectric layer is formed by performing at least twice a step of providing a metal-organic source gas into the chamber during the first time period using a pulse method to grow the ferroelectric grains.

5 Claims, 8 Drawing Sheets

METHODS OF FORMING A FERROELECTRIC LAYER AND METHODS OF MANUFACTURING A FERROELECTRIC CAPACITOR INCLUDING THE SAME

CROSS-REFERENCE TO RELATED PATENT APPLICATIONS

This application claims the benefit of Korean Patent Application No. 10-2007-76678, filed on Jul. 31, 2007, in the Korean Intellectual Property Office, the disclosure of which is incorporated herein by reference in its entirety.

FIELD OF THE INVENTION

Embodiments of the present invention relate to methods of forming a ferroelectric layer and methods of manufacturing a ferroelectric capacitor using the same. More particularly, embodiments of the present invention relate to methods of forming a ferroelectric layer by performing a chemical vapor deposition (CVD) process in which a source gas is repeatedly provided, and methods of manufacturing a ferroelectric capacitor using at least similar processes.

BACKGROUND OF THE INVENTION

Generally, semiconductor devices may be divided into two categories: volatile semiconductor memory devices and non-volatile semiconductor memory devices. Volatile semiconductor memory devices, such as a dynamic random access memory (DRAM) device or a static random memory (SRAM) device, typically maintain data only when power is continuously supplied thereto, whereas non-volatile semiconductor memory devices, such as an erasable programmable read-only memory (EPROM) device, an electrically erasable programmable read-only memory (EEPROM) device or a flash memory device, may maintain data stored therein even when the power supply is interrupted or turned off. A ferroelectric random access memory (FRAM) device has characteristics similar to those of random access memory (RAM) devices, which are volatile memory devices and capable of both reading and writing, as well as characteristics of read-only memory (ROM) devices, which are non-volatile devices. Until now, the FRAM devices have had operation speeds relatively slower than those of the DRAM devices at least where the level of technology for manufacturing the FRAM devices has not advanced commensurate to that of the level of technology for manufacturing the DRAM devices. However, the FRAM devices generally possess desirable characteristics for storing data even when power is not supplied thereto at least because of spontaneous polarization characteristics. Accordingly, the FRAM devices may be useful for memory devices such as a calculator, which does not generally require high operation speeds, or a memory device for storing programs, in which data is not written frequently, yet storing data is important. Additionally, the FRAM devices may be operated with a power level lower than that of the EPROM devices or the EEPROM devices, and the number of inputs and outputs of the FRAM devices is generally larger than that of the EPROM devices or the EEPROM devices.

Ferroelectric materials that have been developed may include lead zirconate titanate (PZT or $Pb(Zr, Ti)O_3$) and strontium bismuth tantalate (SBT or $SrBi_2Ta_2O_9$). PZT may be manufactured by a plasma chemical vapor deposition (CVD) process and may have the advantage of possessing a large remnant polarization. However, a PZT layer may be highly fatigued when subjected to repeated polarization inversion. Additionally, PZT includes toxic lead (Pb). Alternatively, an SBT layer may not be readily fatigued when subjected to repeated polarization inversion, even when the polarization inversion is repeated more than approximately 1,000 times using a platinum (Pt) electrode, and the SBT layer may have an advantage of not having an imprint phenomenon of a polarization-voltage (P-V) hysteresis loop. However, the SBT layer is thermally treated at a high temperature over about 800° C. for crystallization.

A method of manufacturing the FRAM device including the above ferroelectrics is disclosed in Korean Laid-Open Patent Publication Nos. 2001-113271 and 2001-4306, and U.S. Pat. Nos. 6,351,006 and 6,194,228. When a PZT layer is formed on a substrate by a metal-organic CVD (MOCVD) process, a source gas for forming the PZT layer may be continuously provided, so that the PZT layer may have a rough surface. Thus, a FRAM device including the PZT layer may have poor electrical characteristics. More particularly, when the PZT layer is transferred so that an upper electrode may be formed thereon, remaining gases may be reacted with oxygen gas to form by-products having a large resistance on the PZT layer, and the PZT layer may have a rough surface. Accordingly, forming the upper electrode on the PZT layer may be complicated, and the upper electrode may be easily detached from the PZT layer. Additionally, reactive defects may be generated in a lower electrode by diffusion of the ferroelectric material in a deposition process, at least because the PZT layer is thermally treated at a temperature over about 650° C. for crystallization. The defects may deteriorate the electrical characteristics of the FRAM device.

An atomic layer deposition (ALD) process for forming a multi-element dielectric layer performed at a temperature under about 650° C. is disclosed in Korean Laid-Open Patent Publication No. 2006-3895, in an attempt to solve the above problems of the CVD process. According to the above-referenced publication, the ALD process includes a deposition process, a first purge process, an oxidation process and a second purge process in one cycle. When one cycle of the ALD process is performed, a vaporized mixed source is provided once. However, at least due to the characteristics of the ALD process, performing the ALD process requires a longer period of time than a CVD process, at least because two purge processes and an oxidation process are required in one cycle of the ALD process for depositing a layer. Additionally, developing source gases for forming a ferroelectric layer that are suitable for an ALD process is often met with difficulty.

SUMMARY OF THE INVENTION

Embodiments of the present invention provide methods of forming a ferroelectric layer having improved electrical characteristics. The methods of forming a ferroelectric layer described herein may also be formed at a low temperature under about 650° C.

Embodiments of the present invention provide methods of manufacturing a ferroelectric capacitor including a ferroelectric layer having improved electrical characteristics. The methods of manufacturing a ferroelectric capacitor described herein may also be formed even at a low temperature under about 650° C.

According to some embodiments of the present invention, methods of forming a ferroelectric layer are presented. At least two different types of metal-organic sources may be vaporized. The metal-organic source gas may be provided into a chamber into which an oxidation gas may be provided during a first time period to form ferroelectric grains on a substrate. A ferroelectric layer may be formed by performing, at least twice, a step including providing a metal-organic source gas into the chamber during the first time period using a pulse technique to grow the ferroelectric grains.

According to some embodiments of the present invention, further methods of forming a ferroelectric layer are presented. At least two different types of metal-organic sources may be vaporized. The metal-organic source gas may be provided into a chamber into which an oxidation gas may be provided during a first time period to form ferroelectric grains on a substrate. A heat treatment may be performed on the ferroelectric grains while concurrently stopping the process of providing the metal-organic source gas during a second time period that is substantially longer than the first time period for initially providing the metal-organic source gas. A ferroelectric layer may be formed by performing, at least twice, a step of providing the metal-organic source gas during the first time period and performing a heat treatment on the ferroelectric grains while concurrently stopping the process of providing the metal-organic source gas during the second time period in order to grow the ferroelectric grains. Consequently, a ferroelectric layer having a cubic or cubic-like structure generally containing oxygen, e.g., a perovskite structure, can be formed on the substrate.

According to some embodiments of the present invention, forming the metal-organic source gas may be performed by vaporizing a mixture including at least two different metal-organic sources. Providing the metal-organic source gas may include providing the metal-organic source gas together with at least one carrier gas selected from the group consisting of argon gas, helium gas and nitrogen gas, and wherein the carrier gas and the oxidation gas are provided at a flow rate ratio in a range of about 1:2 to about 1:5. The oxidation gas may be continuously provided into the chamber while forming the ferroelectric layer.

According to some embodiments of the present invention, the metal-organic source gas may be oxidized by the oxidation gas in the chamber and deposited on the substrate to form the ferroelectric grains and to grow the ferroelectric grains. The ferroelectric grains may be crystallized at a temperature in a range of about 450° C. to about 650° C. while the ferroelectric grains are formed or continue to grow on the substrate. The ferroelectric layer may include lead zirconate titanate (PZT, [Pb(Zr, Ti)O$_3$]), strontium bismuth tantalate (SBT, [SrBi$_2$Ta2O$_3$]), bismuth lanthanum titanate (BLT, [Bi(La, Ti)O$_3$]), lead lanthanum zirconate titanate (PLZT, [Pb(La, Zr)TiO$_3$]), lead niobium-zirconate titanate (PNZT, [Pb(Nb, Zr, Ti)O$_3$]), bismuth ferric oxide (BFO, [BiFeO$_3$]) and/or barium strontium titanate (BST, [Bi(Sr, Ti)O$_3$]).

According to further embodiments of the present invention, methods of manufacturing a ferroelectric capacitor are also provided. A lower electrode layer may be formed on a substrate. At least two different types of metal-organic sources may be vaporized. The metal-organic source gas may be provided into a chamber into which an oxidation gas may be provided during a first time period to form ferroelectric grains on a surface of a substrate. Providing the metal-organic source gas into the chamber during the first time period may be repeatedly performed at least twice in order to grow the ferroelectric grains, so that a ferroelectric layer may be formed on the lower electrode layer. As a result, a ferroelectric layer having a cubic or cubic-like structure generally containing oxygen, e.g., a perovskite structure, may be formed on the lower electrode layer. An upper electrode layer may be formed on the ferroelectric layer.

According to some embodiments of the present invention, methods of manufacturing a ferroelectric capacitor are provided. A lower electrode layer may be formed on a substrate. At least two different types of metal-organic sources may be vaporized. The metal-organic source gas may be provided into a chamber into which an oxidation gas may be provided during a first time period to form ferroelectric grains on a substrate. A heat treatment may be performed on the ferroelectric grains while concurrently stopping the process of providing the metal-organic source gas during a second time period that is substantially longer than the first time period of initially providing the metal-organic source gas. A ferroelectric layer may be formed by performing, at least twice, a step of providing the metal-organic source gas during the first time period and performing a heat treatment on the ferroelectric grains while concurrently stopping the process of providing the metal-organic source gas during the second time period to form the ferroelectric grains and to further grow the ferroelectric grains. As a result, a ferroelectric layer having a cubic or cubic-like structure generally containing oxygen, e.g., a perovskite structure, may be formed on the lower electrode layer. An upper electrode layer may be formed on the ferroelectric layer. An upper electrode layer may be formed on the ferroelectric layer.

According to some embodiments of the present invention, the lower electrode layer may be formed by forming a first lower electrode layer including metal nitride on the substrate and forming a second lower electrode layer including metal, metal oxide, or a combination thereof, on the first lower electrode layer. The upper electrode layer may be formed by forming a first upper electrode layer and forming a second upper electrode layer on the first upper electrode layer.

According to embodiments of the present invention, a chemical vapor deposition (CVD) process including repeatedly providing a gas including at least two different metal-organic sources with intervals into a chamber into which an oxidation gas is provided, so that crystallization occurs at a temperature under 650° C. to form a ferroelectric layer without undesirable defects, by-products or impurities. Thus, ferroelectric properties such as data preservation, polarization maintenance, etc. may be improved or maintained, and enhance leakage current characteristics of the ferroelectric layer. Additionally, electrical properties of a ferroelectric capacitor including the ferroelectric layer described herein may be largely improved. Furthermore, the CVD process according to embodiments of the present invention providing a source gas repeatedly with intervals may reduce the time for forming the ferroelectric layer compared with an atomic layer deposition (ALD) process, so that the CVD process may be applicably suitable for mass production of semiconductor devices.

BRIEF DESCRIPTION OF THE DRAWINGS

Embodiments of the present invention will be more clearly understood from the following detailed description and further taken in conjunction with the accompanying drawings. FIGS. 1 to 11 represent non-limiting, exemplary embodiments as described herein.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

It will be understood that when an element, such as a layer, is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

Hereinafter, the present invention will be explained in detail with reference to the accompanying drawings.

Figure 1:
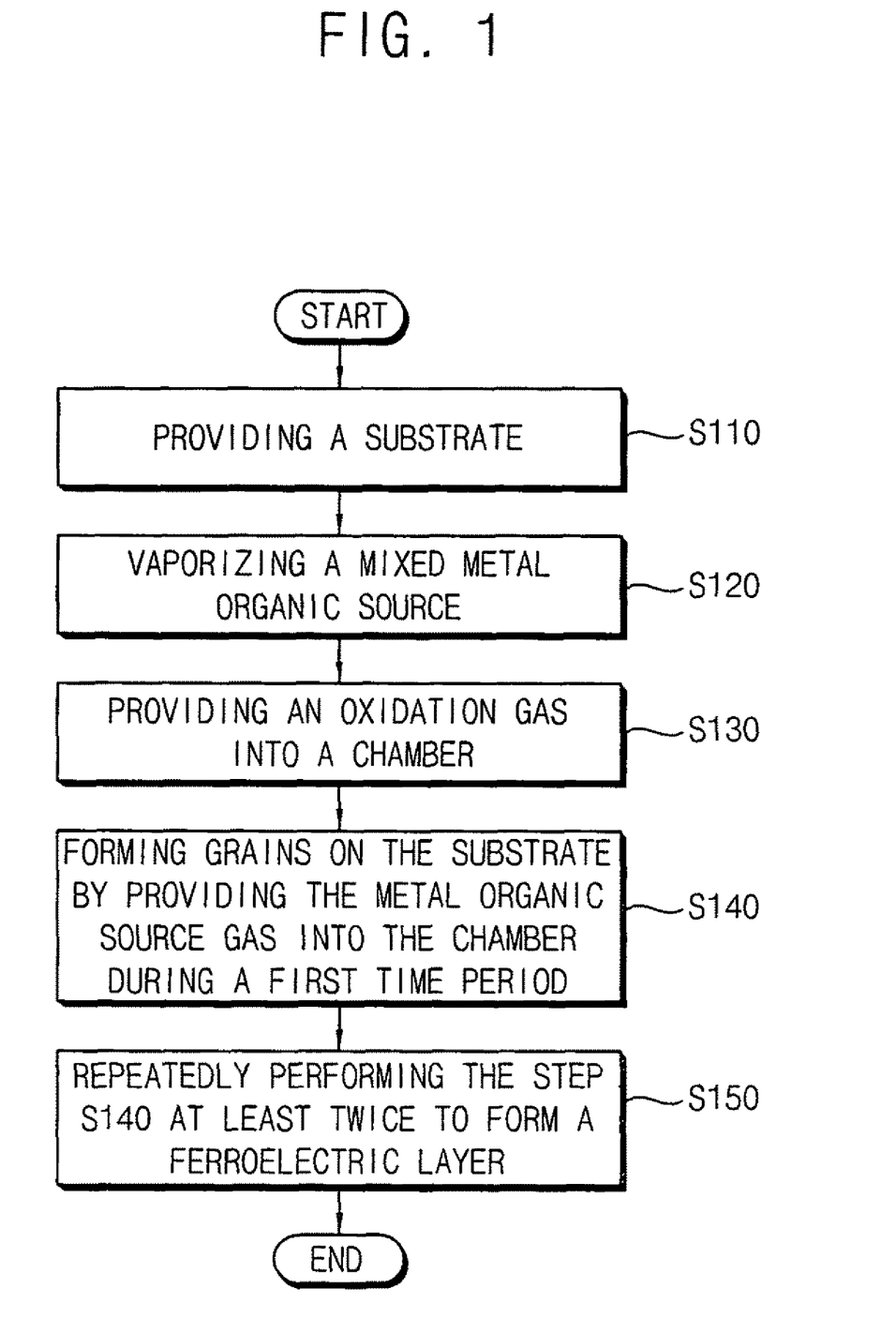
FIG. 1 presents a flowchart illustrating a method of forming a ferroelectric layer in accordance with some embodiments of the present invention.

FIG. 1 presents a flowchart illustrating a method of forming a ferroelectric layer in accordance with some embodiments of the present invention. Referring to FIG. 1, a substrate on which the ferroelectric layer may be formed is provided in step S110. In some embodiments of the present invention, a silicon wafer, a silicon-on-insulator (SOI) substrate or a germanium substrate may be used as the substrate. A conductive layer may be further formed on the substrate. The conductive layer may serve as a diffusion barrier layer for preventing oxygen in the ferroelectric layer from diffusing into the substrate and improving crystallization of ferroelectric materials in the ferroelectric layer.

In some embodiments, the conductive layer may include a metal nitride such as titanium aluminum nitride (TiAlN), aluminum nitride (AlN), titanium nitide (TiN), titanium silicon nitride (TiSiN), tantalum nitride (TaN), tantalum silicon nitride (TaSiN), tungsten nitride (WN), etc. Alternatively, the conductive layer may include a metal such as iridium (Ir), platinum (Pt), palladium (Pd), gold (Au), etc.

In some embodiments of the present invention, a single-crystalline metal oxide substrate may serve as the substrate on which the ferroelectric layer is formed. Examples of the single-crystalline metal oxide substrate may include a single-crystalline aluminum oxide ($Al_2O_3$) substrate, a single-crystalline strontium titanium oxide ($SrTiO_3$) substrate, and a single-crystalline magnesium oxide (MgO) substrate. The single-crystalline metal oxide substrate may be suitable when the ferroelectric layer is directly formed on the substrate without forming a conductive layer thereon.

Referring again to FIG. 1, a metal-organic source for forming the ferroelectric layer may be vaporized in step S120. At least two kinds of metal-organic sources are used for forming the ferroelectric layer such that the ferroelectric layer includes at least two kinds of metals. Thus, at least two types of metal-organic sources are mixed together and vaporized to form a mixed metal-organic source gas.

In some embodiments of the present invention, after the at least two kinds of metal-organic sources are mixed and provided into an evaporator, the mixed metal-organic sources may be heated to form the mixed metal-organic source gas. In this instance, the evaporator may be heated to provide an internal temperature in a range of about 170° C. to about 250° C. at which the mixed metal-organic sources may be vaporized. In other embodiments of the present invention, at least two kinds of metal-organic sources may be heated in separate evaporators, respectively, and then the vaporized metal-organic sources are mixed to form the mixed metal-organic source gas.

Examples of the ferroelectric layer formed may include a barium strontium titanate (BST or $Ba_{(1-x)}Sr_xTiO_3, 0<x<1$) layer, a bismuth titanate (BTO or $Bi_4Ti_3O_{12}$) layer, a strontium bismuth tantalite niobate (SBT or $SrBi_2(Ta_{1-x}Nb_x)_2O_9$, $0<x<1$) layer, a bismuth lanthanum titanate (BLT or $(Bi, La)_4Ti_3O_{12}$) layer, a lead zinc titanate (PZT or $Pb(Zn_xTi_{1-x})O_3$, $0<x<1$) layer or a lead lanthanum zirconate titanate (PLZT or $Pb(La,Zr)TiO_3$) layer. For example, when the ferroelectric layer is a BST layer, a barium precursor, a strontium precursor and a titanium precursor may be used as the metal-organic sources. When the ferroelectric layer is a BTO layer, a barium organic precursor and a titanium organic precursor may be used as the metal-organic sources. When the ferroelectric layer is an SBT layer, a strontium organic precursor, a bismuth organic precursor and a titanium organic precursor may be used as the metal-organic sources. When the ferroelectric layer is a PZT layer, a lead organic precursor, a zinc organic precursor and a titanium organic precursor may be used as the metal-organic sources. When the ferroelectric layer is a PLZT layer, a lead organic precursor, a zirconium organic precursor, a titanium precursor and a niobium organic precursor may be used as the metal-organic sources.

In some embodiments, the metal-organic precursor may have a structure in which an organic ligand is combined to a metal such as lead, barium, strontium, titanium, zirconium, niobium, etc. Examples of the ligand may include alkoxide, phenyl, acetate, halogen atoms, etc. For example, a PZT layer may be formed using a mixed organic source including one lead organic precursor of $Pb(dpm)_2(pmdt)$, $Pb(dpm)_2$ and $Pb(THD)_2$, one zirconium precursor of $Zr(dmhd)_2(dpm)_2$ and $Zr(MMP)_4$, and one titanium precursor of $Ti(dpm)_2(OiPr)_2$, $Ti(OiPr)_2(dpm)2$ and $Ti(MMP)_4$. After the metal-organic precursors are melted in an organic solution and mixed together, the mixed metal-organic precursors may be vaporized, such as, in an evaporator, thereby forming the mixed metal-organic source gas.

As presented in FIG. 1, an oxidation gas including oxygen may be provided into a chamber into which the substrate is provided in step S130. In some embodiments of the present invention, a reaction chamber in which a metal-organic chemical vapor deposition (MOCVD) process is performed may be used to form the ferroelectric layer. The substrate may be loaded on a susceptor disposed in the reaction chamber. The substrate may be maintained at a temperature in a range of about 450° C. to about 650° C., and in some embodiments, about 400° C. to about 600° C.

In some embodiments, the oxidation gas including oxygen is heated to a temperature in a range of about 300° C. to about 600° C. and provided onto the substrate in the reaction chamber. Examples of the oxidation gas may include oxygen ($O_2$) gas, ozone ($O_3$) gas, nitrogen dioxide ($NO_2$) gas, nitrous oxide ($N_2O$) gas, etc. These gases may be used alone or in a combination thereof.

The oxidation gas may oxidize the metal of a metal-organic source gas for forming the ferroelectric layer and may be provided into the reaction chamber continuously at a uniform flow rate. The flow rate of the oxidation gas may be changed according to a flow rate of the vaporized organic source gas. In some embodiments, the oxidation gas may be provided at a flow rate in a range of about 500 sccm to about 3,000 sccm.

The mixed metal-organic source gas may be provided into the reaction chamber in which the oxidation gas may be provided during a first time period to form a ferroelectric grain on the substrate as presented in step S140 of FIG. 1.

In some embodiments, the mixed metal-organic source gas may be provided into the reaction chamber during the first time period together with a carrier gas, which may be continuously provided into the chamber. For example, the mixed metal-organic source gas may include a gas vaporized from a mixed solution of metal-organic precursors such as lead (Pb), zirconium (Zr) and titanium (Ti). In a particular embodiment, the mixed metal source gas includes a gas vaporized from a mixed solution of $Pb(THD)_2$, $Zr(MMP)_4$ and $Ti(MMP)_4$. The mixed metal-organic source gas is provided onto the substrate at a flow rate in a range of about 200 sccm to 1,500 sccm, at which ferroelectric grains may be formed on the substrate, for a period of time in a range of about 5 seconds to about 50 seconds, or in some embodiments, in a range of about 10 seconds to about 30 seconds.

Accordingly, ligands in the mixed metal-organic source gas provided into the reaction chamber may be separated from the metal in the mixed metal-organic source gas, and the mixed metal-organic source gas may be reacted with the oxidation gas, so that the mixed metal-organic source gas may be transformed into a metal oxide having ferroelectricity. As a result, the metal oxide may be chemically vapor deposited onto the substrate to form ferroelectric grains. The grains may have a size of about several nanometers to about several tens of nanometers, and thus, the grains may be crystallized on the substrate having a low temperature under about 600° C. when the grains are formed on the substrate.

A flow rate ratio of a carrier gas provided into the reaction chamber to that of the oxidation gas may be in a range of about 1:2 to about 1:5. That is, the carrier gas and the oxidation gas may be provided into the reaction chamber at a flow rate ratio in a range of about 1:2 to about 1:5.

Figure 2:
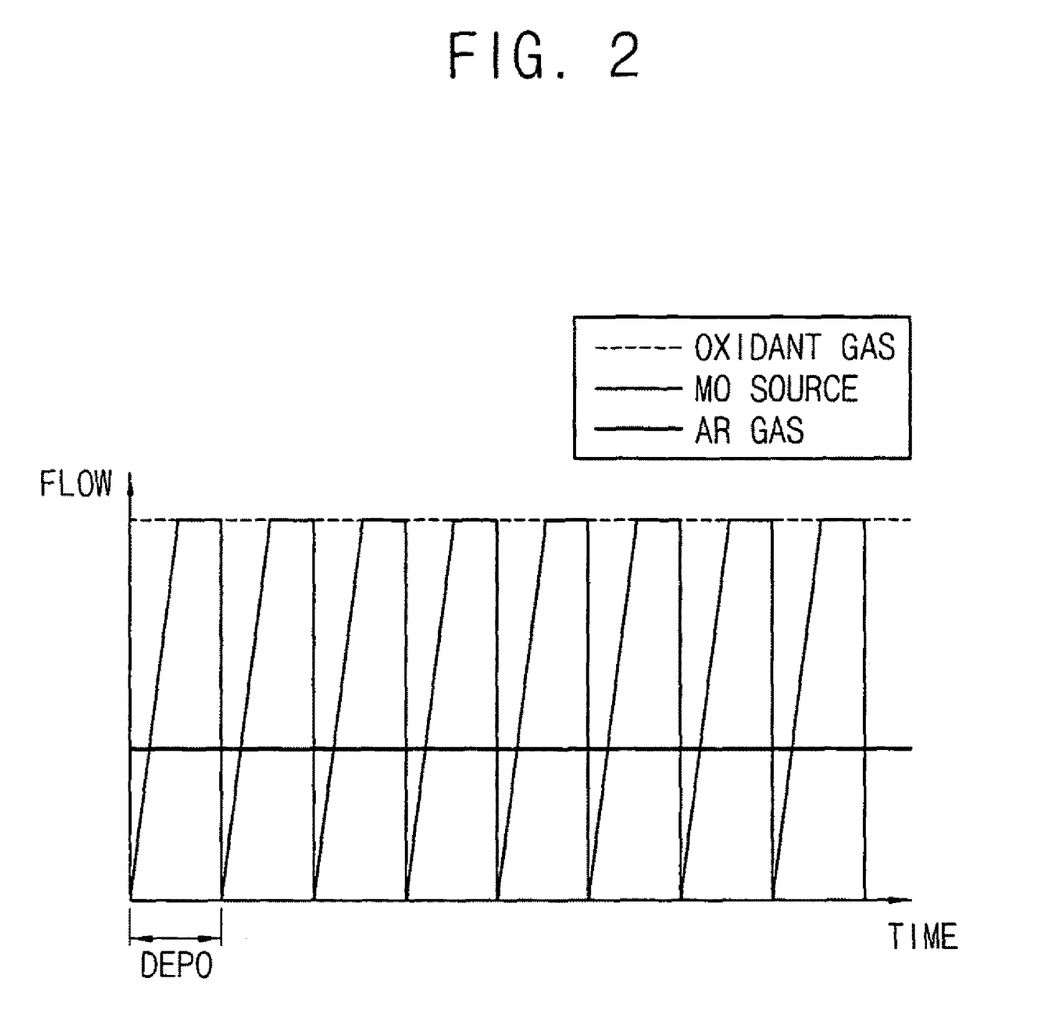
FIG. 2 presents a diagram illustrating a gas flow described in reference to the method illustrated in FIG. 1.

The mixed metal-organic source gas may be repeatedly provided into the reaction chamber into which the oxidation gas is provided during a first time period to grow the ferroelectric grains in step S150 as shown in FIG. 1. Step S150 wherein the mixed metal-organic source gas may be provided into the reaction chamber together with the carrier gas, which may be continuously provided, during the first time period is repeatedly performed at least twice, so that the ferroelectric grains may be grown on the substrate. As shown in FIG. 2, the mixed metal-organic source gas may be repeatedly provided for a period of time in a range of about 5 seconds to about 50 seconds using a pulse technique, so that the ferroelectric grains may be grown to form a ferroelectric layer on the substrate.

In some embodiments, a ferroelectric metal compound may be adsorbed onto the ferroelectric grains so that the ferroelectric grains gradually grow to form a ferroelectric layer. The ferroelectric grains formed according to some embodiments of the present invention may grow at a rate substantially lower than that of ferroelectric grains formed by a conventional chemical vapor deposition (CVD) process. Thus, the ferroelectric grains may be crystallized at a temperature of the substrate while the ferroelectric grains grow. Accordingly, an additional heat treatment for crystallization of the ferroelectric grains may not be required.

Figure 3:
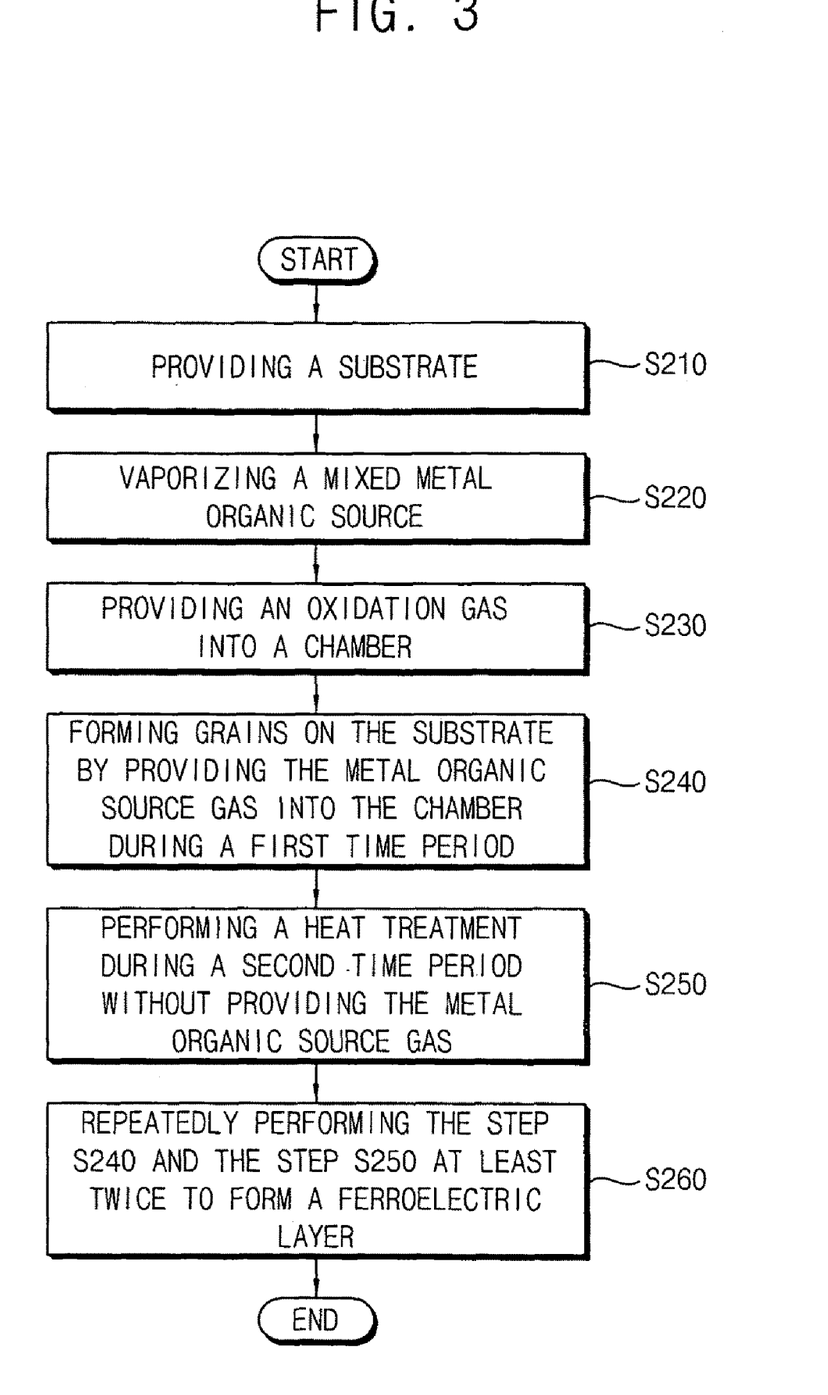
FIG. 3 presents a flowchart illustrating a method of forming a ferroelectric layer in accordance with some embodiments of the present invention.

FIG. 3 presents a flowchart illustrating a method of forming a ferroelectric layer in accordance with some embodiments of the present invention. Referring to FIG. 3, a metal-organic source for forming a ferroelectric layer may be vaporized after a substrate is provided in steps S210 and S220. At least two kinds of metal-organic sources may be mixed and vaporized to form the mixed metal-organic source gas for forming the ferroelectric layer where the ferroelectric layer includes at least two kinds of metal. Providing the substrate and vaporizing the metal-organic source are disclosed in descriptions with reference to FIG. 1. Accordingly, that repeated descriptions of these steps will be omitted.

An oxidation gas including oxygen may be provided into a chamber into which the substrate is provided on step S230. The oxidation gas including oxygen may be provided into the chamber, in which an MOCVD process may be performed, for forming a ferroelectric layer heated to a temperature in a range of about 400° C. to about 600° C. Exemplary oxidation gases including oxygen may include oxygen ($O_2$) gas, ozone ($O_3$) gas, nitrogen dioxide ($NO_2$) gas, nitrous oxide ($N_2O$) gas, etc. These gases may be used alone or in a combination thereof. Although the flow rate of the oxidation gas may be changed according to a flow rate of the organic source gas, the oxidation gas has a flow rate in a range of about 500 sccm to about 3,000 sccm.

The mixed metal-organic source gas may be provided into the reaction chamber in which the oxidation gas is provided during a first time period to form ferroelectric grains on the substrate in step S240 (S240). The mixed metal-organic source gas may be provided onto the substrate with a flow rate in a range of about 200 sccm to 1,500 sccm, which may form ferroelectric grains on the substrate, for a period of time in a range of about 5 seconds to about 50 seconds, and in some embodiments, in a range of about 10 seconds to about 30 seconds.

Ligands in the mixed metal-organic source gas provided into the reaction chamber may be separated from each other due to an inner temperature thereof and the mixed metal-organic source gas may be reacted with the oxidation gas, so that the mixed metal-organic source gas may be transformed into a metal oxide having ferroelectricity. As a result, the metal oxide may be chemically deposited onto the substrate to form ferroelectric grains. Conditions and particular descriptions for forming the grains are provided in descriptions with reference to the FIG. 1, and thus, repeated descriptions will be omitted.

As shown in FIG. 3, supplying the vaporized metal-organic source stops during a second time period that is substantially longer than the first time period in step S250. More specifically, growth of the grains formed on the substrate may be stopped during the second time period by stopping the supply of a metal-organic source gas provided into the reaction chamber together with the carrier gas during the second time period. In some embodiments, the carrier gas and the oxidation gas may be continuously provided into the reaction chamber without stopping the supply of the metal-organic source gas. For example, the first time period has a range of about 5 seconds to about 50 seconds. The second time period has a range of about 10 seconds to about 70 seconds. Accordingly, the grains formed on the substrate are exposed to a temperature under about 600° C. during the second time period without growth. Because unreacted materials in the grains may be vaporized for the second time, the exposed grains include a minimum of impurities, so that the grains are sufficiently crystallized. As a result, ferroelectric grains having excellent ferroelectric properties are formed on the substrate.

Figure 4:
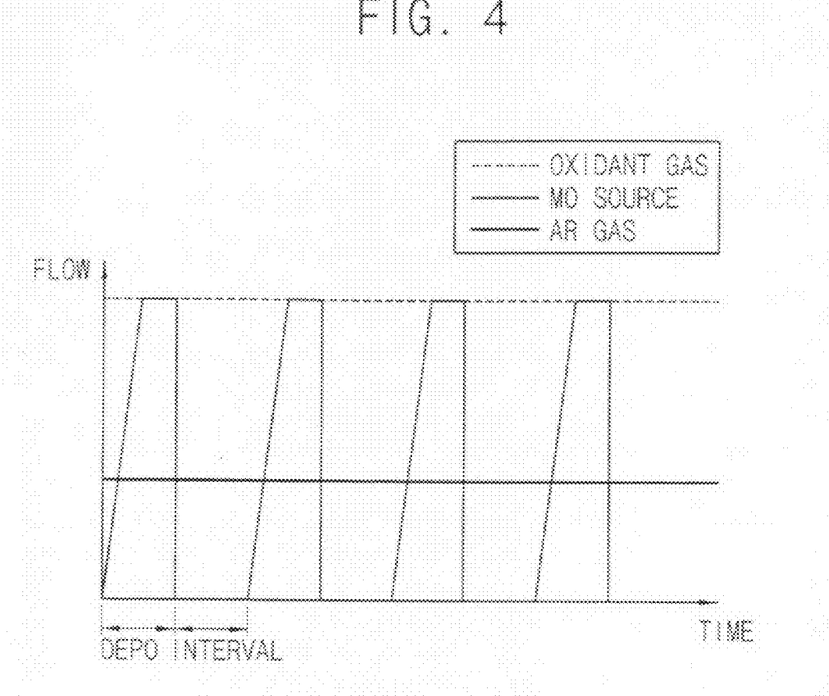
FIG. 4 presents a diagram illustrating a gas flow described in reference to the method illustrated in FIG. 3.

Providing the metal-organic source gas into the reaction chamber into which the oxidation gas may be provided during the first time period and performing a heat treatment on the grains without supplying the metal-organic source gas into the reaction chamber during the second time period are repeated at least twice in step S260. For example, the ferroelectric layer may be formed by performing a CVD process using a pulse technique such that a metal-organic source gas is provided in intervals as in the diagram illustrating a gas flow in FIG. 4. The ferroelectric layer may possess a perovskite crystalline structure while the ferroelectric metal compounds are adsorbed onto the ferroelectric grains and then the ferroelectric grains may gradually grow. Accordingly, the ferroelectric grains may have a crystallization rate substantially lower than that of ferroelectric grains formed by a conventional CVD process. The ferroelectric grains may be crystallized at a temperature in a range of about 450° C. to about 650° C., which is a temperature of the substrate on which the ferroelectric grains may be formed. As a result, an additional heat treatment process for crystallizing the ferroelectric grains and removing impurities in the ferroelectric grains may not be necessary for forming a final ferroelectric layer.

Hereinafter, characteristics of a ferroelectric layer formed according to some embodiments of the present invention, in which a ferroelectric metal-organic source gas may be repeatedly provided into a reaction chamber for about 15 seconds using a pulse method, are evaluated. Characteristics of a ferroelectric layer formed by a conventional CVD process, in which the ferroelectric metal-organic source gas is continuously provided into a reaction chamber, are also evaluated.

Figure 5:
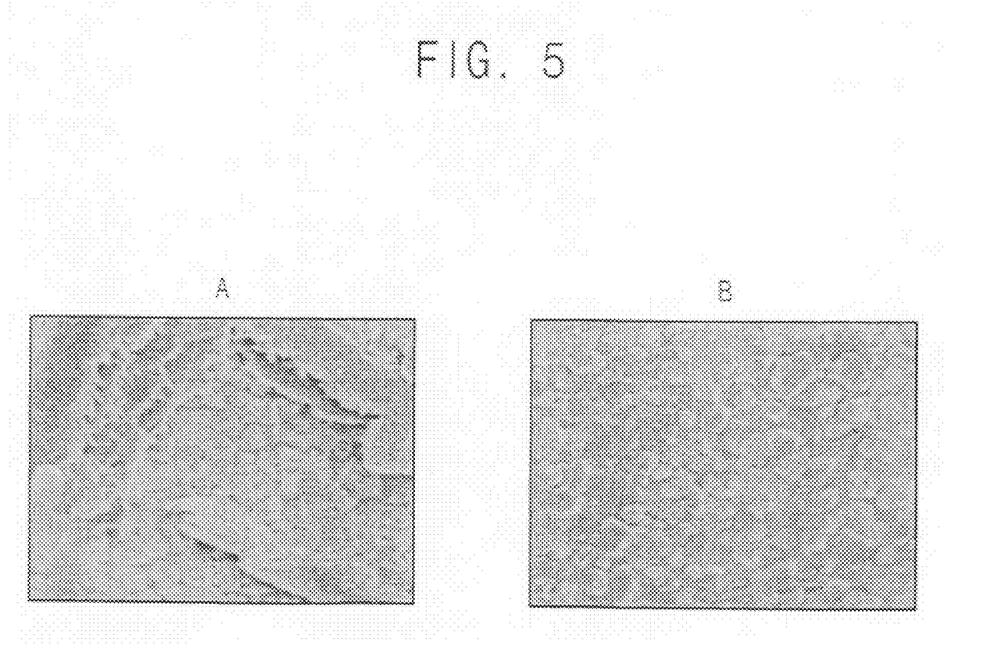
FIGS. 5A and 5B present scanning electron microscope (SEM) pictures illustrating ferroelectric layers formed by methods having different types of ferroelectric metal-organic source gases.

FIGS. 5A and 5B present scanning electron microscope (SEM) pictures illustrating ferroelectric layers formed by methods having different steps for providing the ferroelectric metal-organic source gases. Particularly, FIG. 5A is a SEM picture illustrating a first ferroelectric layer formed by a method in which a ferroelectric metal-organic source gas is continuously provided into a reaction chamber. FIG. 5B is a SEM picture illustrating a second ferroelectric layer formed by a method in which a ferroelectric metal-organic source gas is repeatedly provided into a reaction chamber using a pulse method.

Referring to FIG. 5A, the first ferroelectric layer has by-products such as a metal oxide thereon. However, referring to FIG. 5B, the second ferroelectric layer has a uniform crystalline structure and minimal, if any, by-products thereon, which are generated during a deposition process. Referring to FIGS. 5A and 5B altogether, the first ferroelectric layer has a crystalline structure larger than that of the second ferroelectric layer.

Figure 6:
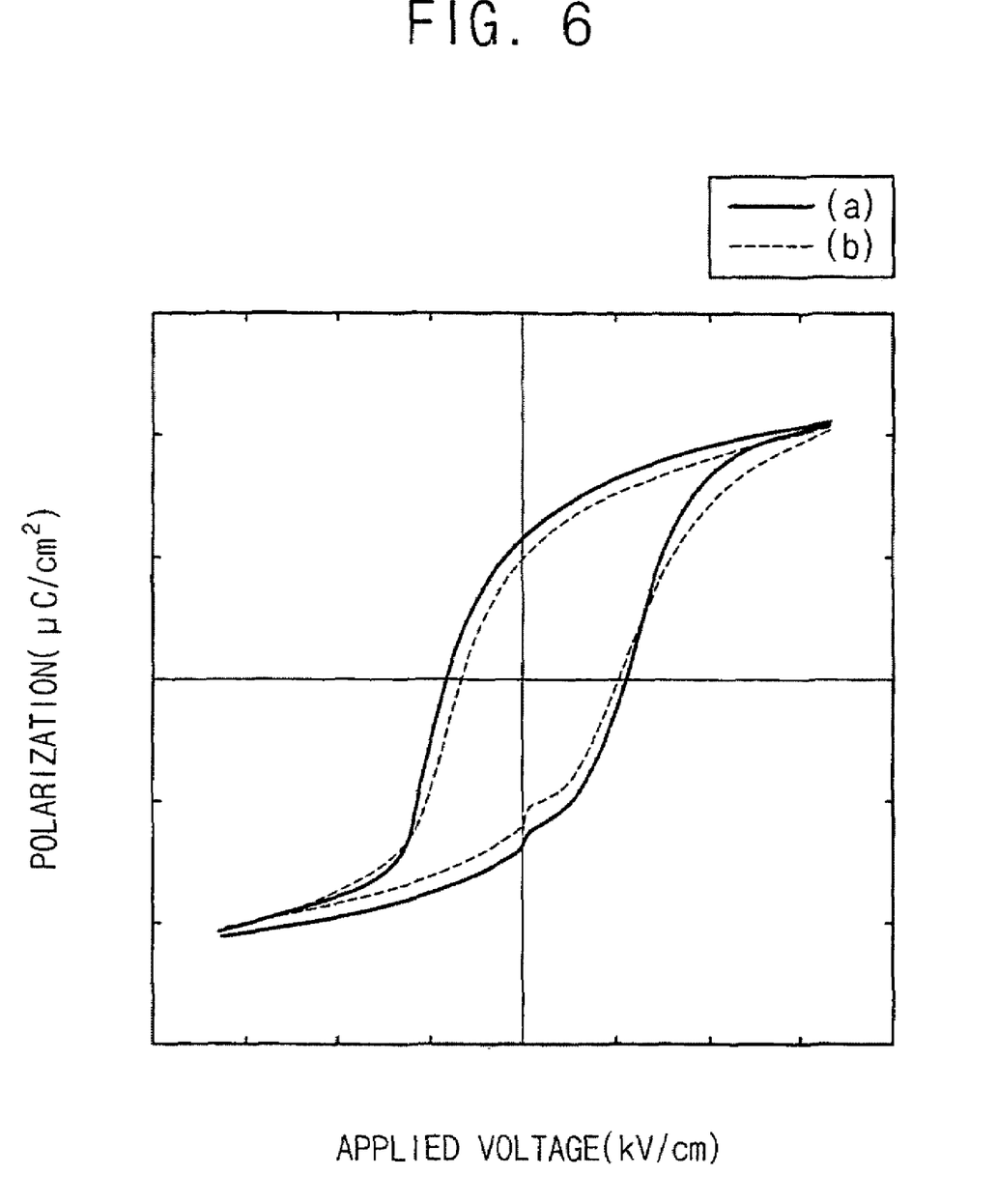
FIG. 6 presents a graph showing polarization-electric field (P-E) hysteresis curves of ferroelectric layers formed by methods having different types of ferroelectric metal-organic source gases.

FIG. 6 presents a graph showing polarization-electric field (P-E) hysteresis curves of ferroelectric layers formed by methods having different steps for providing the ferroelectric metal-organic source gases. In FIG. 6, (a) is a P-E hysteresis curve of a ferroelectric layer formed by a conventional CVD process in which a metal-organic source gas is continuously provided, and (b) is a P-E hysteresis curve of a ferroelectric layer formed by a CVD process in which a metal-organic source gas is provided using a pulse method. As shown in FIG. 6, curve (b) has P-E characteristics that are better than those of curve (a).

Figure 7:
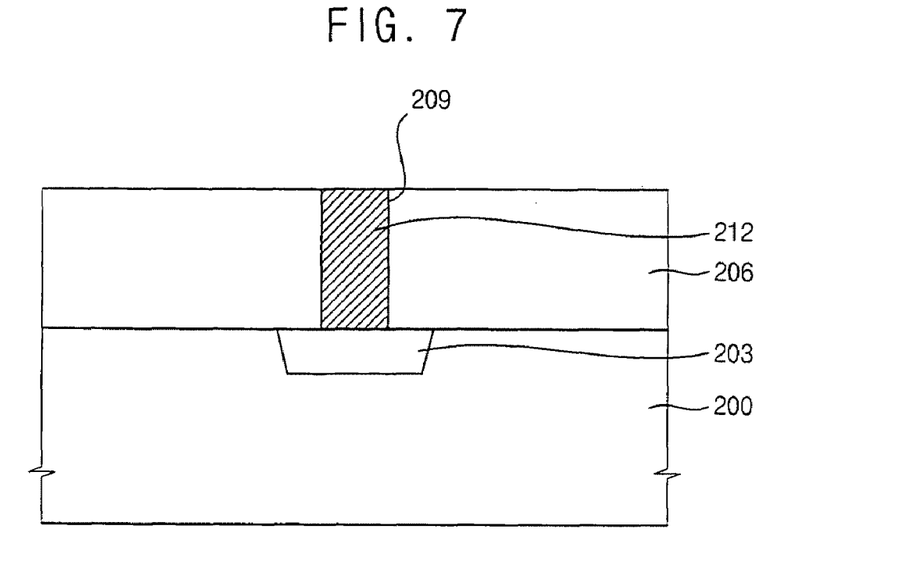
FIGS. 7 to 11 present cross-sectional views illustrating methods of manufacturing a ferroelectric capacitor in accordance with some embodiments of the present invention.

FIGS. 7 to 11 present cross-sectional views illustrating a method of manufacturing a ferroelectric capacitor in accordance with some embodiments of the present invention. Referring to FIG. 7, a lower structure 203 may be formed on a substrate 200. The substrate 200 may include a semiconductor substrate, a metal oxide substrate, etc. For example, the substrate 200 may include a silicon wafer, an SOI substrate, a single-crystalline aluminum oxide substrate, a single-crystalline strontium titanate substrate, a single-crystalline magnesium oxide substrate, etc. The lower structure 203 may include a contact region formed at a certain region of the substrate 200, a conductive wire, a conductive pad, a pad, a plug, a contact, a gate structure and/or a transistor.

An insulation structure 206 may be formed on the substrate 200 to cover the lower structure 203. The insulation structure 206 includes at least one insulation layer formed by a CVD process, a plasma-enhanced CVD (PECVD) process, a high-density plasma CVD (HDP-CVD) process or an atomic layer deposition (ALD) process.

In some embodiments of the present invention, the insulation structure 206 may include at least one insulation layer or an insulating interlayer including an oxide such as borophosphosilicate glass (BPSG), phosphosilicate glass (PSG), undoped silicate glass (USG), plasma-enhanced tetraethyl orthosilicate (TEOS), high-density plasma chemical vapor deposition (HDP-CVD) oxide, spin-on glass (SOG), flowable oxide (FOx) and plasma-enhanced tetraethyl orthosilicate (PE-TEOS). In other embodiments, the insulation structure 206 may have a structure in which a first insulation layer including an oxide and a second insulation layer including a nitride are sequentially stacked. For example, the first insulation layer may include silicon oxide and the second insulation layer may include silicon nitride. In still other embodiments, the insulation structure 206 may have a multilayer structure in which at least one first insulation layer and at least one second insulation layer are alternately or sequentially stacked.

The insulation structure 206 may be partially etched to form an opening 209 exposing the lower structure 203 through the insulation structure 206. In some embodiments, a photoresist pattern (not shown) may be formed on the insulation structure 206, and the insulation structure 206 may be partially etched using the photoresist pattern as an etching mask to form the opening 209 exposing the lower structure 203. The photoresist pattern may be removed by an ashing process and/or a stripping process. In some embodiments, an anti-reflection layer (ARL) may be further formed between the photoresist pattern and the insulation structure 206, and the opening 209 exposing the lower structure 203 may be formed through the insulation structure 206.

A first conductive layer filling the opening 209 may be formed on the insulation structure 206. The first conductive layer may be partially removed to form a pad 212 filling the opening 209 and being electrically connected to the lower structure 203.

In some embodiments of the present invention, the first conductive layer may include a polysilicon doped with impurities or a conductive material such as a metal or a conductive metal nitride. For example, the first conductive layer may be formed using tungsten, aluminum, copper, titanium, tungsten nitride, aluminum nitride or titanium nitride. The first conductive layer may be formed by a sputtering process, a CVD process, an ALD process or a pulsed laser deposition (PLD) process. The pad 212 may be formed by partially removing the first conductive layer using a chemical mechanical polishing (CMP) process, an etch-back process or a combination process thereof. The pad 212 electrically connects a lower electrode layer 221 (see FIG. 8) to the lower structure 203.

Figure 8:
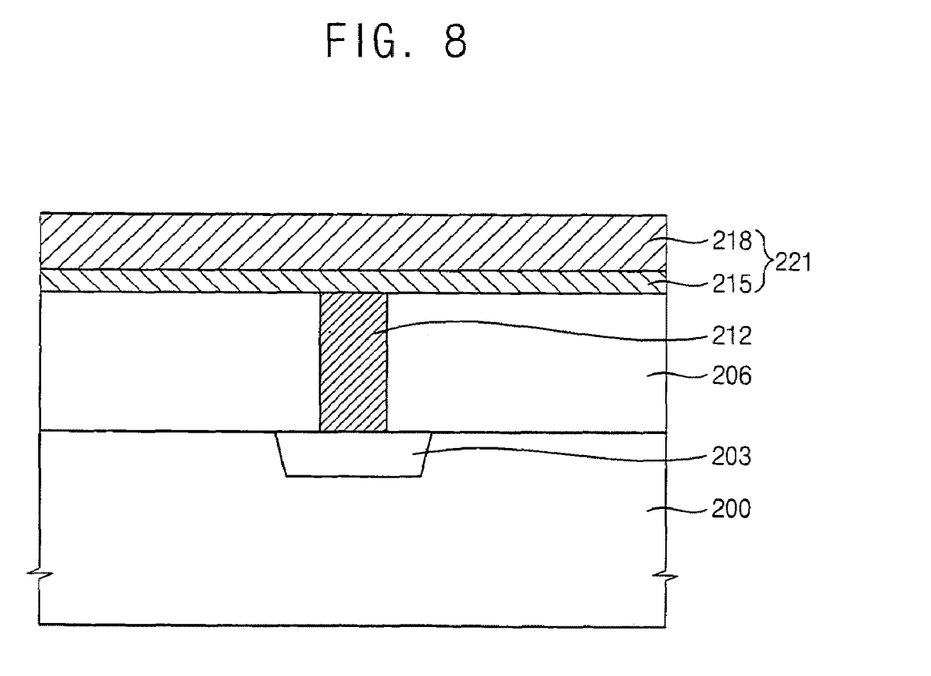

Referring to FIG. 8, the lower electrode layer 221 may be formed on the insulation structure 206 and the pad 212. The lower electrode layer 221 may be formed by forming a second electrode layer 218 on a first lower electrode layer 215 after forming the first lower electrode 215 on the pad 212 and the insulation structure 206. In some embodiments, the first lower electrode layer 215 may be formed by depositing a metal nitride through an electron beam deposition (EBD) process, a sputtering process, a CVD process or an ALD process. For example, the first lower electrode layer 215 may be formed using titanium aluminum nitride (TiAlN), titanium nitride (TiN), titanium silicon nitride (TiSiN), tantalum nitride (TaN), tungsten nitride (WN) or tantalum silicon nitride (TaSiN). In some embodiments, the first lower electrode layer 215 has a thickness in a range of about 10 nm to about 50 nm from an upper face of the insulation structure 206.

The second lower electrode layer 218 may be formed using iridium (Ir), platinum (Pt), ruthenium (Ru), palladium (Pd) or gold (Au). In some embodiments, the second lower electrode layer 218 may be formed using a iridium-ruthenium (Ir—Ru) alloy, iridium oxide ($IrO_2$), strontium ruthenium oxide ($SrRuO_3$), calcium nickel oxide ($CaNiO_3$), calcium ruthenium oxide ($CaRuO_3$), etc. In some embodiments, the second lower electrode layer 218 may be formed using a metal alloy such as iridium ruthenium alloy or a metal oxide such as strontium ruthenium oxide ($SrRuO_3$) iridium oxide ($IrO_2$), calcium nickel oxide ($CaNiO_3$), calcium ruthenium oxide ($CaRuO_3$), etc. The second lower electrode layer 218 may be formed by an EBD process, a sputtering process, a CVD process, an ALD process or a PLD process. The second lower electrode layer 218 may have a thickness in a range of about 10 nm to about 200 nm from an upper face of the first lower electrode layer 215.

In some embodiments, an adhesive layer (not shown) may be formed between the insulation structure 206 and the first lower electrode layer 215 so that adhesive characteristics between the insulation structure 206 and the first lower electrode layer 215 may be enhanced. The adhesive layer may be formed by depositing a metal or a conductive metal nitride through a sputtering process, a CVD process, an ALD process or a PLD process. For example, the adhesive layer may be formed using titanium, aluminum, tungsten, titanium nitride, tantalum nitride, aluminum nitride or tungsten nitride.

Figure 9:
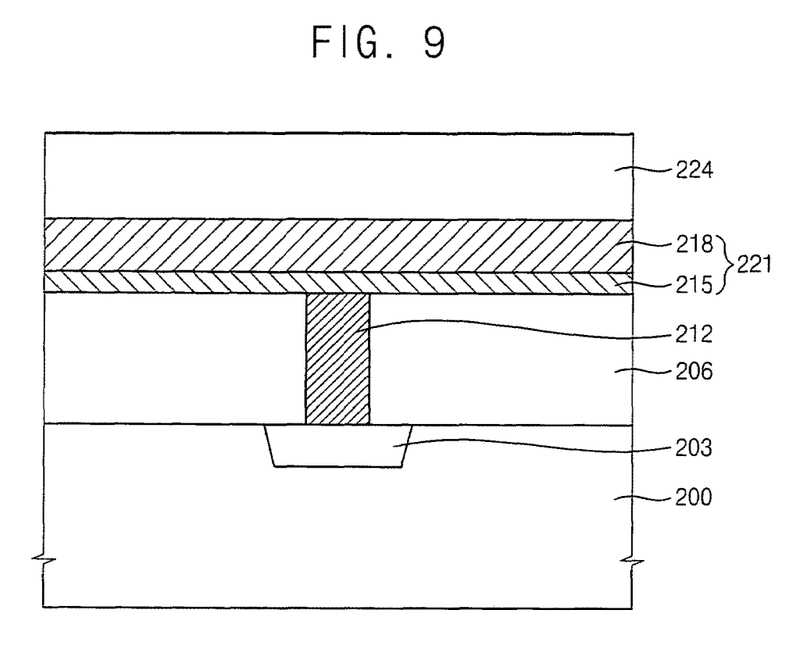

Referring to FIG. 9, a ferroelectric layer 224 may be formed on the lower electrode layer 221. In some embodiments, at least two kinds of metal-organic sources may be used for forming the ferroelectric layer. An oxidation gas is provided, and the vaporized mixed metal-organic source including the at least two kinds of metal-organic sources, i.e., the metal-organic source gas is provided into a chamber in which the substrate is loaded only during a first time period, so that ferroelectric grains are formed on the substrate 200. The ferroelectric grains are grown by performing at least twice the step of providing the metal-organic source gas into the chamber only during a first time period. As a result, a ferroelectric layer 224 having desirable characteristics is formed on the lower electrode layer 221.

In some embodiments, at least two kinds of metal-organic sources may be used for forming the ferroelectric layer. Then, the vaporized metal-organic source including the at least two kinds of metal-organic sources, i.e., the metal-organic source gas is provided into a chamber only during a first time period into which an oxidation gas is provided, so that ferroelectric grains are formed on the lowe r electrode layer 221. A heat treatment may be performed on the ferroelectric grains during a second time period that is substantially longer than the first time period during which second period of time the heat treatment is performed in the absence of providing the metal-organic source gas. By-products in the ferroelectric grains may be removed by the heat treatment, so the ferroelectric grains may have improved crystalline structures. Then, the step of providing the metal-organic source gas only during the first time period and performing the heat treatment during the second time period without the metal-organic source gas is repeatedly performed at least twice, in order to grow the ferroelectric grains. As a result, the ferroelectric layer 224 having good characteristics may be formed on the lower electrode layer 221.

In some embodiments, the vaporized metal-organic source may be formed by vaporizing a mixture including at least two kinds of metal-organic sources. The vaporized mixed metal-organic source, i.e., the mixed metal-organic source gas, may be provided into a chamber together with a carrier gas including argon gas, helium gas and/or nitrogen gas. When the carrier gas and the oxidation gas are provided into the reaction chamber, a flow rate ratio of the carrier gas to the oxidation gas may be in a range of about 1:2 to about 1:5.

In some embodiments, the mixed metal-organic source gas may be provided onto the substrate 200 at a flow rate in a range of about 200 sccm to 1,500 sccm, at which ferroelectric grains may be formed on the substrate 200, for a period of time in a range of about 5 seconds to about 50 seconds, and in some embodiments, for about 10 seconds to about 30 seconds. In this instance, the reaction chamber may be maintained at a pressure in a range of about 0.5 Torr to about 3 Torr. The oxidation gas including oxygen and the carrier gas may be heated at a temperature in a range of about 300° C. to about 600° C. and then provided onto the substrate 200 in the reaction chamber. Examples of the oxidation gas may include oxygen ($O_2$) gas, ozone ($O_3$) gas, nitrogen dioxide ($NO_2$) gas, nitrous oxide ($N_2O$), etc. These gases may be used alone or in a combination thereof.

The mixed metal-organic sources may include lead zirconate titanate (PZT, [Pb(Zr, Ti)$O_3$]), strontium bismuth tantalate (SBT, [SrBi$_2$Ta2$O_9$]), bismuth lanthanum titanate (BLT, [Bi (La, Ti)$O_3$]), lead lanthanum zirconate titanate (PLZT, [Pb (La, Zr)Ti$O_3$]), lead niobium-zirconate titanate (PNZT, [Pb (Nb, Zr, Ti)$O_3$]), bismuth ferric oxide (BFO, [BiFe$O_3$]) or barium strontium titanate (BST, [Bi(Sr, Ti)$O_3$]). For example, when a PZT layer is formed as the ferroelectric layer 224, the mixed metal-organic sources may be formed by mixing a lead organic precursor, a zirconium organic precursor and a titanium organic precursor, and then vaporizing the lead organic precursor, the zirconium organic precursor and the titanium organic precursor. The detail descriptions of the organic sources were described above, and thus, the detail descriptions regarding the same are omitted here.

Figure 10:
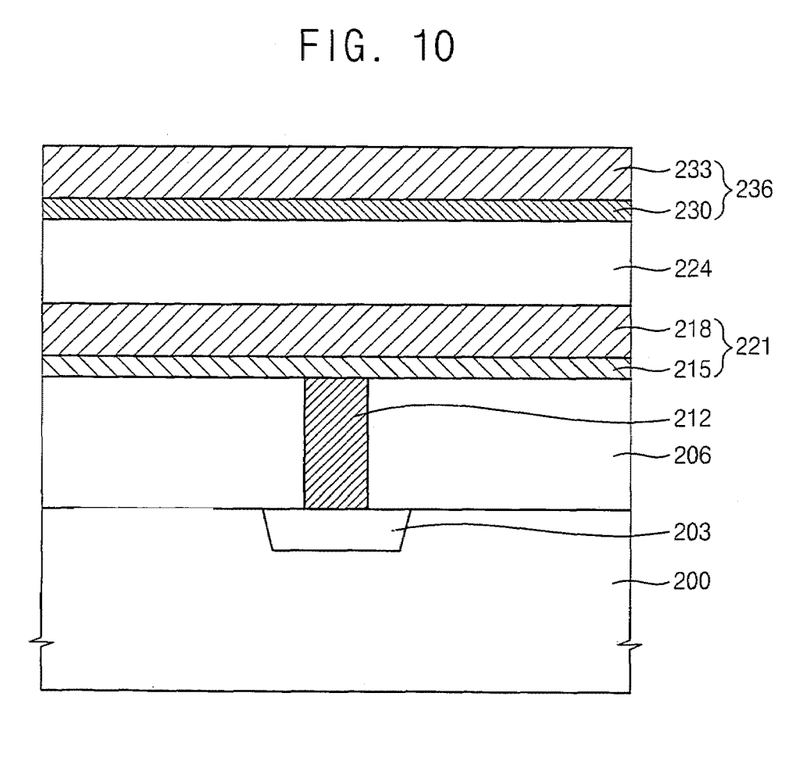

Referring to FIG. 10, an upper electrode layer 236 may be formed on the ferroelectric layer 224. The upper electrode layer 236 may be formed by sequentially forming a first upper electrode layer 230 and a second upper electrode layer 233 on the ferroelectric layer 224.

The first upper electrode layer 230 may be formed on the ferroelectric layer 224 by an EBD process, a sputtering process, a CVD process or an ALD process. The first upper electrode layer 230 may have a thickness in a range of about 10 nm to about 20 nm from an upper face of the ferroelectric layer 224. The first upper electrode layer 230 may be formed using a metal oxide such as strontium ruthenium oxide (SrRu$O_3$; SRO), STO, lanthanum nickel oxide (LnNi$O_3$; LNO) or calcium ruthenium oxide (CaRu$O_3$; CRO). For example, the first upper electrode layer 230 may be formed by depositing SRO on the ferroelectric layer 224 through a sputtering process. When the first upper electrode layer 230 is formed, a reaction chamber, in which the substrate 200 is provided, may be maintained at a temperature in a range of about 20° C. to about 350° C. and under a pressure in a range of about 3 mTorr to about 10 mTorr. The first upper electrode layer 230 may be formed by applying power in a range of about 300 W to about 1,000 W under an inert gas atmosphere including argon gas, nitrogen gas or helium gas. For example, the inert gas may include only argon gas, and the argon gas may be provided into the reaction chamber at a flow rate in a range of about 10 sccm to about 100 sccm.

In some embodiments, the second upper electrode layer 233 may be formed using a metal such as iridium, platinum, ruthenium, palladium or gold, and has a thickness in a range of about 10 nm to about 200 nm from the upper face of the first upper electrode layer 230. In other embodiments, the second upper electrode layer 233 may be formed using a metal alloy such as a iridium-ruthenium (Ir—Ru) alloy, or a metal oxide such as iridium oxide (Ir$O_2$), strontium ruthenium oxide (SrRu$O_3$), calcium nickel oxide (CaNi$O_3$), calcium ruthenium oxide (CaRu$O_3$), etc. In still other embodiments, the second upper electrode layer 233 may have a multilayer structure in which a strontium ruthenium oxide (SrRu$O_3$) layer and an iridium (Ir) layer are stacked or an iridium oxide (Ir$O_2$) layer and an iridium (Ir) layer are stacked. The second upper electrode layer 233 may be formed by an EBD process, a sputtering process, a CVD process, an ALD process or a PLD process. When the second upper electrode layer 233 is formed, a reaction chamber, in which the substrate 200 is provided, may be maintained at a temperature in a range of about 20° C. to about 350° C. and under a pressure in a range of about 3 mTorr to about 10 mTorr. The second upper electrode layer 233 may be formed by applying power in a range of about 300 W to about 1,000 W under an inert gas atmosphere including argon gas, nitrogen gas or helium gas. For example, the inert gas may include only argon gas, and the argon gas may be provided into the reaction chamber at a flow rate in a range of about 10 sccm to about 100 sccm.

After forming the upper electrode layer 236, a heat treatment for the upper electrode layer 236 may be further performed. The upper electrode layer 236 may be crystallized by the heat treatment. In some embodiments, the upper electrode layer 236 may be thermally treated by a rapid thermal process (RTP) under a mixed gas including oxygen gas, nitrogen gas, etc. For example, the RTP may be performed at a temperature in a range of about 500° C. to about 600° C. for period of time in a range of about 30 seconds to about 180 seconds.

Figure 11:
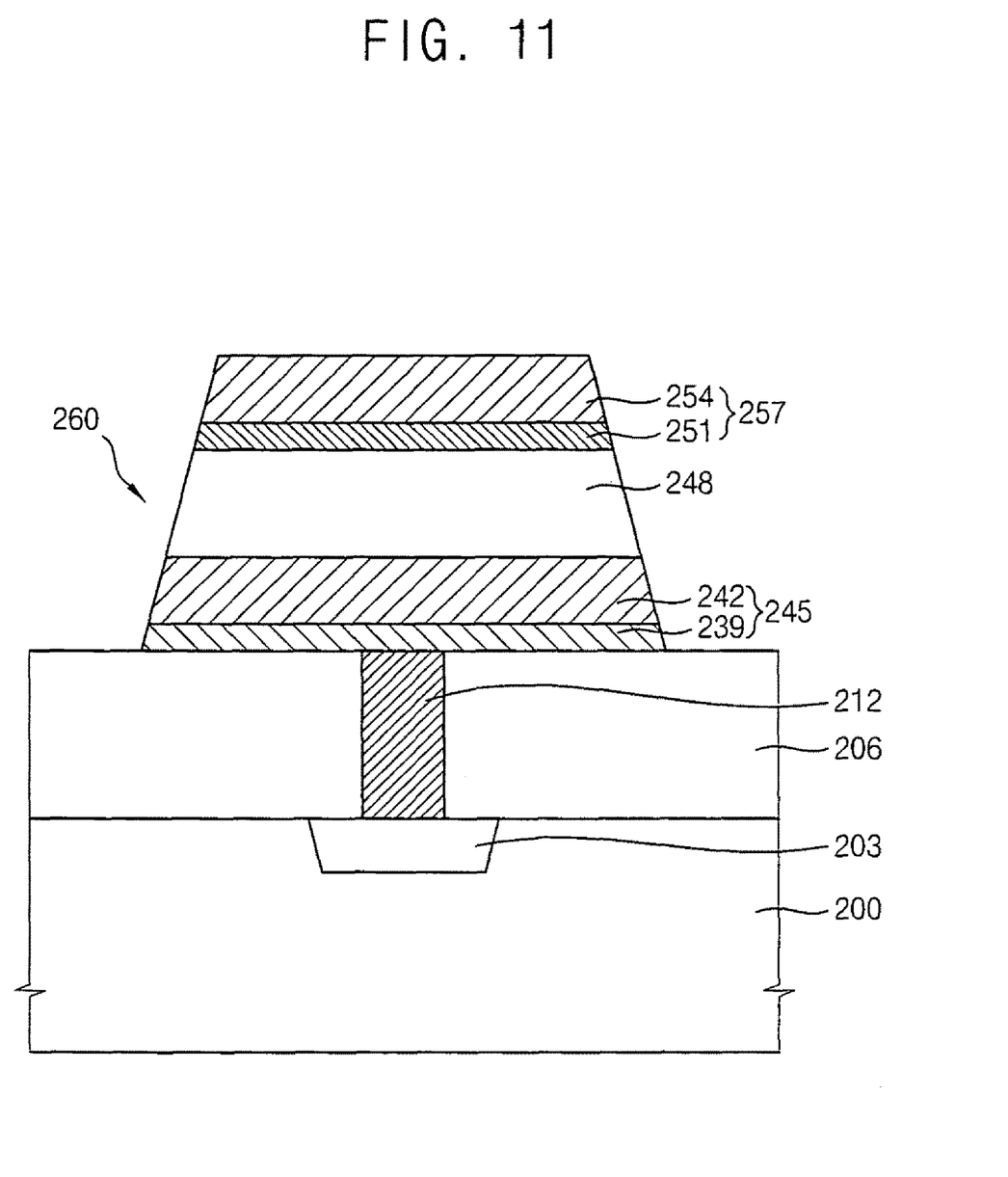

Referring to FIG. 11, an etching mask (not shown) may be formed on the upper electrode layer 236. The upper electrode layer 236, the ferroelectric layer 224 and the lower electrode 221 exposed by the etching mask may be sequentially etched to form a ferroelectric capacitor 260 on the substrate 200.

The ferroelectric capacitor 260 may be formed on the pad 212 and the insulation structure 206, and has a structure in which a lower electrode 245, a ferroelectric layer pattern 248 and an upper electrode 257 are stacked. The lower electrode 245 includes a first lower electrode layer pattern 239 and a second lower electrode layer pattern 242. The upper electrode 257 may include a first upper electrode layer pattern 251 and a second upper electrode layer pattern 254 sequentially formed on the ferroelectric layer pattern 248. An insulating interlayer (not shown) may be formed on the upper electrode 257 and an upper wiring (not shown) connected to the upper electrode 257 may be formed to complete a semiconductor device including the ferroelectric capacitor 270.

According to some embodiments of the present invention, a ferroelectric layer may be formed by a CVD process in which a mixed gas including at least two kinds of metal-organic sources is repeatedly provided using a pulse method into a chamber into which an oxidation gas is provided. The ferroelectric layer may be crystallized into a cube or cube-like structure containing oxygen, e.g., a perovskite structure, under a temperature of about 650° C., and undesirable by-products are minimally formed, if at all, on a surface thereof.

Accordingly, ferroelectric characteristics such as data maintenance or polarization maintenance may be maintained and leakage current from the ferroelectric layer may also be reduced. Also, electrical characteristics of a ferroelectric capacitor including the ferroelectric layer may be improved. Furthermore, the CVD process in which the mixed metal-organic source gas is provided using a pulse method may be suitable for a process for manufacturing semiconductor devices at least because the time for manufacturing the ferroelectric layer may be remarkably reduced in the CVD process when compared to that of an ALD process.

The foregoing is illustrative of the present invention and is not to be construed as limiting thereof. Although a few exemplary embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims.

Therefore, it is to be understood that the foregoing is illustrative of the present invention and is not to be construed as limited to the specific exemplary embodiments disclosed, and that modifications to the disclosed embodiments, as well as other exemplary embodiments, are intended to be included within the scope of the appended claims. The present invention is defined by the following claims, with equivalents of the claims to be included therein.

What is claimed is:

1. A method of forming a ferroelectric layer, comprising:
    (a) providing into a chamber a metal-organic source gas comprising a mixture of at least two metal-organic sources and further providing into the chamber an oxidation gas to form ferroelectric grains on a substrate, wherein the metal-organic source gas and oxidation gas are provided into the chamber during a first time period;
    (b) performing a heat treatment on the ferroelectric grains for a second time period that is substantially longer than the first time period while concurrently ceasing to provide to the chamber the metal-organic source gas; and
    (c) repeating (a) and (b) at least once to form the ferroelectric layer.

2. The method of claim 1, wherein the oxidation gas is provided into the chamber continuously while the ferroelectric layer is formed.

3. The method of claim 1, wherein the first time period is in a range of about 5 seconds to about 50 seconds and the second time period is in a range of about 10 seconds to about 70 seconds.

4. The method of claim 1, wherein forming the ferroelectric grains comprises oxidizing the metal-organic source gas using the oxidation gas in the chamber.

5. A method of forming a ferroelectric capacitor, comprising:
    forming a lower electrode layer on a substrate;
    providing into a chamber a metal-organic source gas comprising a mixture of at least two metal-organic sources and further providing into the chamber an oxidation gas to form ferroelectric grains on a substrate, wherein the metal-organic source gas and oxidation gas are provided into the chamber during a first time period;
    performing a heat treatment on the ferroelectric grains for a second time period that is substantially longer than the first time period while concurrently ceasing to provide to the chamber the metal-organic source gas;
    forming the ferroelectric layer by performing at least twice a step of providing the metal-organic source gas during the first time period and performing a heat treatment on the ferroelectric grains while concurrently ceasing to provide to the chamber the metal-organic source gas; and
    forming an upper electrode layer on the ferroelectric layer.

* * * * *